SEMICONDUCTOR DEVICES

Filed March 1, 1963 3 Sheets-Sheet 1

INVENTORS
WILLIAM M. TRIGGS &
MARTIN A. BLUMENFELD
BY
W.S. Hill
AGENT

INVENTORS
WILLIAM M. TRIGGS &
BY MARTIN A. BLUMENFELD

W. S. Hill

AGENT

INVENTORS
WILLIAM M. TRIGGS &
MARTIN A. BLUMENFELD
BY
W. B. Hill
AGENT

United States Patent Office 3,241,931

Patented Mar. 22, 1966

3,241,931

SEMICONDUCTOR DEVICES

William Michael Triggs, Raritan, and Martin Albert Blumenfeld, Somerville, N.J., assignors to Radio Corporation of America, a corporation of Delaware Filed Mar. 1, 1963, Ser. No. 262,063
4 Claims. (Cl. 29—195)

This invention relates to improved semiconductor devices.

In the manufacture of semiconductor devices such as diodes, triodes, tetrodes, and the like, utilizing as the substrates crystalline wafers composed of semiconductive materials, it is frequently necessary to make an electrical connection to a semiconductive wafer. The wafer may consist of silicon, silicongermanium alloys, germanium, and the like. Since it is difficult to bond a metallic electrical lead wire directly to a semiconductive wafer, it has heretofore been the usual practice to deposit a metallic mass on at least a portion of the wafer, and then bond the electrical lead wire to the metallic mass. The mass may consist of a pure metal such as aluminum, gold or the like. Alternatively, the mass may consist of a mixture or alloy of several metals, and may include a substance which is a conductivity modifier or doping agent in the particular semiconductor.

In some types of semiconductor devices, at least a portion of the surface of the device is covered by an insulating layer. See, for example, U.S. 2,796,562, issued to S. G. Ellis et al. on June 18, 1957, and assigned to the assignee of this application. The insulating layer may consist of magnesium oxide and hydroxide, as described in U.S. 2,805,968, issued to G. E. Dunn, Jr. on Sept. 10, 1957, and assigned to the assignee of this application. In other semiconductor devices, the insulating layer consists of silicon oxide formed by an oxidizing bath or by anodic oxidation, as described in U.S. 2,875,384, issued to J. T. Wallmark on Feb. 24, 1959, and assigned to the assignee of this application. Field effect devices with an insulating silicon oxide surface layer may have a control electrode over a portion of the insulating layer, as described in U.S. 2,900,531, issued to J. T. Wallmark on Aug. 18, 1959, and assigned to the assignee of this application. Some field effect devices having a control electrode over an insulating surface layer are known as "insulated gate" devices. Electrical connections are applied to the semiconductor materials of these field effect devices, and also on the insulating material thereof.

Various methods have been utilized to make the metallic connections to semiconductor devices. However, it has been found difficult to attach metallic electrodes to semiconductor devices which are partially covered by a layer of insulating material such as silicon oxide. These difficulties are increased when it is desired, as in the fabrication of insulated gate devices, to deposit a good adherent metallic contact on a layer of an insulating material such as silicon oxide and the like in addition to depositing a metal contact layer on the semiconductor wafer itself. Usually, the two or more contacts were applied by two completely different and successive processes, because those methods which were used to form a metallic contact on the semiconductor wafer or die, itself, did not work well on the insulating layer, while those methods used to fabricate a metallic contact on the insulating layer were not satisfactory when applied to the semiconductor.

These and other objects of the invention are accomplished by vacuum evaporating a film of chromium on at least a portion of the surface of a semiconductor device, and depositing a thin layer of silver on said chromium film. In one embodiment of the invention, a metallic contact is made on an insulating layer on at least a portion of the surface of the device. In another embodiment of the invention, an intermediate layer of chromium mixed with silver is deposited between the chromium film and the silver layer to reduce the discontinuity between the chromium and the silver.

The invention will be described in greater detail by the following examples, considered in conjunction with the accompanying drawing, in which.

*Example I*

Figures 1, 2, 3, 4, 5, 6:
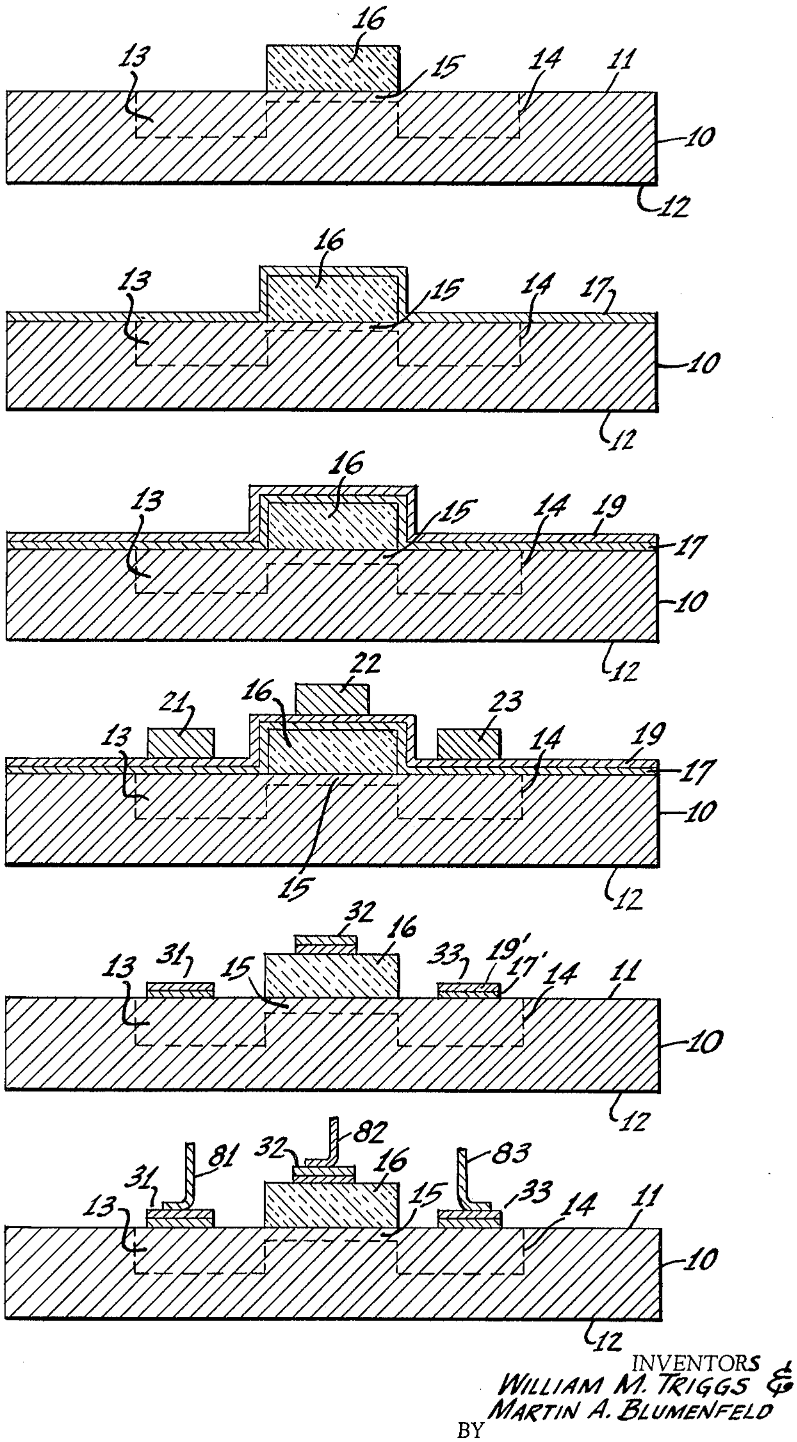
FIGURES 1–6 are cross-sectional views of a semiconductor wafer at successive steps in the fabrication of a semiconductor device according to one embodiment of the invention.

Referring now to FIGURE 1, a wafer 10 of crystalline semiconductive material is prepared with two opposing major faces 11 and 12. The wafer may consist of semiconductive materials such as germanium, silicon, germanium-silicon alloys, and the like. In this example, wafer 10 consists of monocrystalline silicon. The exact size of the wafer is not critical. Suitably, wafer 10 is about 50 mils square and 7 mils thick. The semiconductor wafer may be either P-type or intrinsic, or N-type, and may be of either high resistivity or low resistivity. In this example, wafer 10 consists of high resistivity intrinsic monocrystalline silicon. Immediately adjacent one major face 11, an N conductivity type region 13 is formed. A central portion 15 of region 13 is thinner than the remainder of the region. Methods of forming the shaped region 13, for example by diffusing a donor into face 11 of wafer 10 in two successive steps, are known to the art. The boundary 14 between N-type region 13 and the bulk of wafer 10 becomes an I-N junction. A silicon oxide layer 16 is formed on major face 11 over central portion 15 of region 13. The silicon oxide layer may be formed by any convenient method. When wafer 10 consists of silicon, as in this example, silicon oxide layer 16 may be formed by heating wafer 10 in steam. This treatment results in a silicon oxide layer over the entire exposed wafer surface. The undesired portions of the silicon oxide layer are readily removed by grinding, or by etching. When wafer 10 consists of crystalline semiconductors other than silicon, the silicon oxide layer 16 may be formed by thermally decomposing a siloxane compound so as to deposit silicon oxide on the wafer.

A chromium film 17 (FIGURE 2) is deposited on major wafer face 11 and on silicon oxide layer 16 by evaporation in vacuum. Preferably the residual atmospheric pressure during this step should be not greater than $1\times10^{-4}$ mm. Hg. In this embodiment, the residual atmospheric pressure during the evaporation step is about $1\times10^{-6}$ mm. Hg. It has been found advantageous to keep the wafer 10 at a temperature of about 100° C. to 300° C. during the evaporation steps. This is readily accomplished by positioning the wafer on a resistance heater in an evacuated bell jar during the step of evaporating the chromium film on the wafer. The chromium layer or film thus deposited is preferably rather thin, so that it is difficult to measure the thickness of the chromium film 17 directly. Instead, it is more convenient to monitor the electrical resistivity of the chromium film 17, since the resistivity of the film is inversely proportional to its thickness. It has been found that the chromium film 17 is suitably thick when its electrical resistivity is in the range of about 10 to 400 ohms per square.

A thin layer of silver 19 (FIGURE 3) is now deposited by any convenient method, such as electroplating, chemical deposition, or vacuum evaporation directly on the chromium layer 17. The exact thickness of silver layer 19 is not critical, but is preferably in the range of about 0.1 to 2.0 microns. If vacuum evaporation is used to deposit the silver layer, the residual atmospheric pressure during the evaporation step should preferably be not greater than $1\times10^{-4}$ mm. Hg. In this example, silver layer 19 is about one micron thick, and is deposited by vacuum evaporation at a residual atmospheric pressure of about $1\times10^{-6}$ mm. Hg.

Referring now to FIGURE 4, the silver layer 19 is suitably masked. In this example, one mask 22 is positioned on the silicon oxide layer 16. Masks 21 and 23 are positioned adjacent mask 22 over the thicker portions of region 13. Masks 21, 22 and 23 may suitably consist of an acid resist such as paraffin wax or apiezon wax when acid etchants are utilized. Alternatively, masking may be accomplished by spreading a photoresist such as a bichromated protein on the silver layer 19, exposing the photoresist to a suitable pattern of light, and developing the photoresist. Suitable photoresists include bichromated albumen, bichromated gelatin, bichromated gum arabic, and the like. The hardened polymerized portions 21, 22 and 23 which remain on the wafer after the developing step are suitable masks for alkaline etchants.

Wafer 10 is now etched to remove the unmasked portions of silver layer 19 and chromium film 17. Since silver and chromium have different chemical properties, the first being in Group IB and the second in Group VIB of the Periodic Table, it has been found preferable to treat wafer 10 in two separate etching baths, the first bath removing the silver layer 19, and the second bath removing the chromium film 17. In this example, wafer 10 is first treated for about four to ten minutes in a bath made by dissolving 240 grams ammonium persulfate in sufficient deionized water to make a liter of solution. The bath is maintained at a temperature of about 55° C. to 60° C. This treatment dissolves the unmasked portion of silver layer 19. The wafer is then washed in deionized water. Next, wafer 10 is treated for about one-half to two minutes in a bath made by dissolving 100 grams potassium ferricyanide and 50 grams potassium hydroxide in sufficient deionized water to make a liter of solution. The temperature of this bath is also maintained at about 55° C. to 60° C. This treatment dissolves the unmasked portions of chromium film 17. Wafer 10 is then washed in deionized water, dried, and the remaining portions 21, 22 and 23 of the photoresist are removed by means of a suitable stripper, such as methylene chloride or the like, leaving metallic contacts 31, 32 and 33 (FIGURE 5) on major face 11 of wafer 10. In this example, contact 32 is on the silicon oxide layer 16, while contacts 31 and 33 are on the thicker portions of region 13. Each metallic contact of this embodiment has a duplex structure, consisting of a chromium film 17' covered by a silver layer 19'.

Advantageously, the metallic contacts thus formed may be stabilized by heating the wafer in air at a temperature of about 100° C. to 300° C. for a few minutes.

Referring now to FIGURE 6, metallic electrical lead wires 41, 42 and 43 are attached to metallic contacts 31, 32 and 33 respectively by thermocompression bonding, but any convenient method, such as soldering and the like, may instead be utilized for this purpose. The device is then encapsulated and cased by standard methods known to the art.

Although the device of the example is an insulated gate field effect triode, it will be understood that this is by way of example only, and not limitation, since the method is equally applicable to the fabrication of other types of triodes, and to the fabrication of junction devices generally, including diodes and tetrodes.

An advantage of this example is that good metallic contacts are simultaneously made directly on the semiconductor wafer and also on an insulating layer on a portion of the wafer surface. It has been found that evaporated chromium makes good, adherent contact to silicon oxide. Many other metals, such as evaporated silver, peel off the oxide if deposited directly thereon. However, it will be understood that the method described may also be utilized when it is desired to fabricate only direct metallic contacts on the semiconductor wafer, or when it is desired to fabricate metallic contacts only on an insulating layer on a semiconductor wafer.

*Example II*

In the first embodiment described in Example I above, it was mentioned that there is a discontinuity between the chromium film 17 and the silver layer 19, and that these two metals are chemically dissimilar. For some purposes, it may be desirable to avoid an abrupt change in the composition of the metallic contact, in order to make the contact more stable, and to eliminate or minimize any possibility of peeling the silver layer from the chromium. This is accomplished in the second embodiment as next described.

In this example, a chromium film 17 is deposited by vacuum evaporation on one major face 11 of a semiconductor wafer 10, and also on an insulating layer 16 on a portion of wafer face 11, as described in connection with FIGURE 2. As in the previous embodiment, the thickness of the chromium film is not measured directly, but sufficient chromium is deposited to make the electrical resistivity of chromium film 17 in the range of about 10 to 400 ohms per square.

Figures 7, 8, 9, 10, 11:
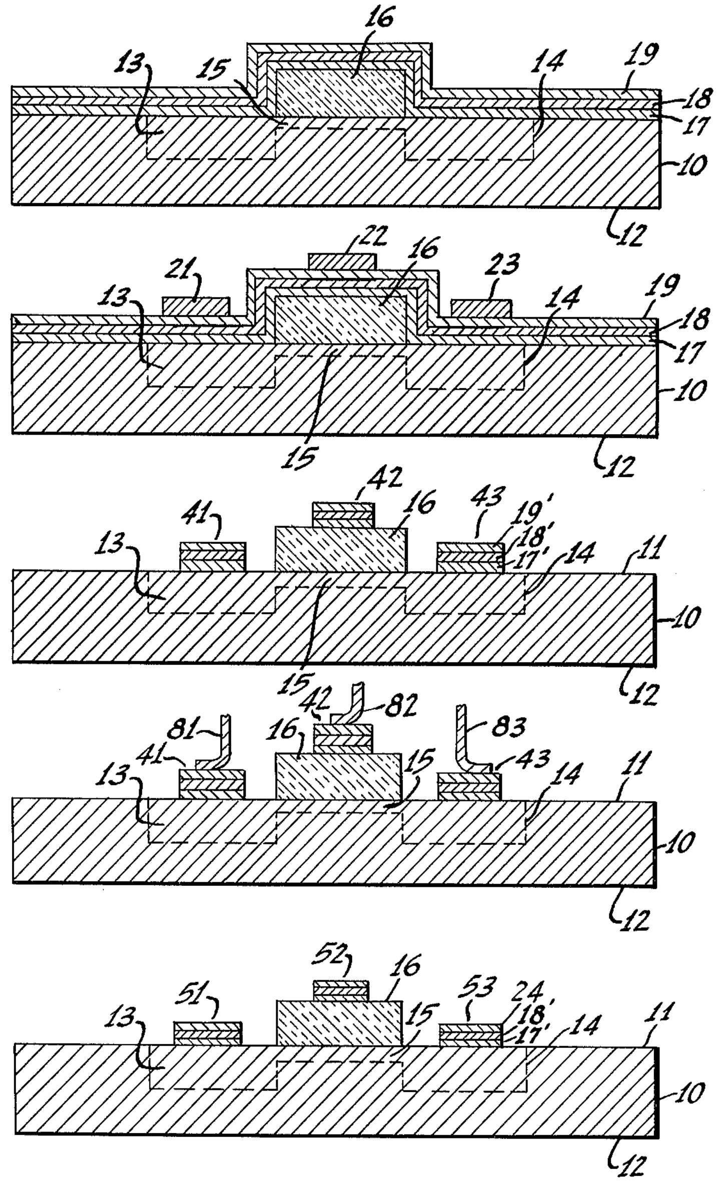
FIGURES 7–10 are cross-sectional views of a semiconductive wafer at successive steps in the fabrication of a semiconductor device in accordance with another embodiment of the invention.
FIGURE 11 is a cross-sectional view of a semiconductive wafer in accordance with still another embodiment of the invention; and, FIGURES 12–15 are cross-sectional views of a semiconductor wafer at successive steps in the fabrication of a semiconductor device according to another embodiment of the invention.

Referring now to FIGURE 7, a layer 18 of mixed silver and chromium is deposited on chromium film 17. This is conveniently accomplished by vacuum evaporation. Wafer 10 is positioned in a bell jar which is maintained at a residual atmospheric pressure of less than $1\times10^{-4}$ mm. Hg and preferably about $1\times10^{-6}$mm. Hg. The bell jar contains two evaporators, such as tungston wire spirals, the first evaporator containing a mass of chromium, and the second containing a mass of silver. Current is supplied to the first evaporator only to deposit chromium film 17 on the wafer. Next, current is supplied to both evaporators simultaneously to deposit the mixed layer 18 consisting of silver and chromium. The mixed silver-chromium layer thus deposited is preferably about 0.1 to 2.0 microns thick. Then the current is supplied to the second evaporator only, so as to deposit a layer 19 of pure silver on the silver-chromium layer 18. Silver layer 19 is preferably about 0.1 to 2.0 microns thick.

Wafer 10 is now suitably masked. In this example, silver layer 19 is covered with a coating of a photoresist, such as a bichromated protein, or the like. Alternatively, a commercially available photoresist such as light-sensitive film-forming polyesters derived from 2-propenylidene malonic compounds and bifunctional glycols containing two to twelve carbon atoms may be utilized, as described in Michiels et al. U.S. Patent 2,956,878, issued Oct. 18, 1960. The photoresist is exposed to a suitable light pattern, and developed. The hardened polymerized portions 21, 22 and 23 (FIGURE 8) which remain on silver layer 19 serve as the mask during the subsequent etching steps.

The semicoductor wafer is now treated in an etching bath to remove the unmasked portions of silver layer 19, silver-chromium layer 18, and chromium film 17. As in Example I above, this may be conveniently accomplished by using two successive etching baths, the first bath consisting of ammonium persulfate, to remove the unmasked silver, and the second consisting of alkaline ferricyanide solution to remove the chromium. Masks 21, 22 and 23 are then removed, for example by treating wafer 10 by a suitable stripper such as methylene chloride, leaving wafer 10 with three metallic contacts 41, 42 and 43 as shown in FIGURE 9. In this example, each metallic contact has a triplex structure, consisting of a chromium film 17′, a silver-chromium layer 18′, and a silver layer 19′. If desired, the metallic contacts may be stabilized by heating the wafer in air for a few minutes at a temperature of about 100° C. to 200° C.

Electrical lead wires 81, 82 and 83 (FIGURE 10) are attached to metallic contacts 41, 42 and 43 respectively by any convenient method, such as thermocompression bonding. In this and in the previous example, the electrical lead wires are attached to the silver layer, which is uppermost and exposed on the surface of each contact.

An advantage of this example is that the composition of the metallic contact formed changes somewhat gradually from pure chromium to mixed chromium and silver to pure silver. Accordingly, there is no abrupt change in the composition of the contact, and hence any tendency for the different layers to separate or peel is minimized.

*Example III*

In the above examples, the upper surface of the metallic contacts consists of pure silver. While thermocompression bonds are readily made to pure silver, and electrical lead wires are readily attached to silver by means of hard solders or brazes, it is frequently desirable that the metallic contact be provided with a soft solderable metallic surface layer, so that electrical lead wires can be readily attached thereto by means of soft solders, i.e., by means of low melting point solders.

Referring now to FIGURE 11, a semiconductive silicon wafer 10 with opposing major faces 11 and 12 and a silicon oxide layer 16 on one major face 11 is prepared as described above in Example I. Metallic contacts 51 and 53 are formed on one major face 11 and contact 52 or silicon oxide layer 16. Each contact has at first a duplex structure consisting of a chromium film 17′ and a silver layer 19′. A layer 24 of soft solderable metal is then deposited on silver layer 19′ by any convenient method. In this embodiment, wafer 10 is dipped in molten lead. The molten lead adheres to the metallic contacts only, but does not adhere to the semiconductor wafer itself. Accordingly, the metallic contacts 51, 52 and 53 thus attain a triplex structure consisting of a chromium film 17′, a silver layer 19′ on the chromium film, and a layer 24 of soft solderable metal (lead in this example) over the silver layer. Other soft solderable metals such as tin, or soft solderable alloys such as lead-tin solder, may be utilized instead of lead. As in the previous examples, the wafer 10 may now be heated in air for a few minutes at about 100° C. to 300° C. This treatment tends to stabilize the electrical resistance of the contacts. Electrical lead wires of nickel-iron alloys, or the like are now readily attached, for example by soldering, to the layer 24 of soft solderable metal on the surface of metallic contacts 51, 52 and 53.

An advantage of this example is that a large number of the semiconductor devices can be mounted in a jig, and corresponding numbers of electrical lead wires pressed against the soft solderable metallic surface on metallic contacts previously formed on the semiconductor devices. The assemblage consisting of the jig, the devices, and the lead wires, is then heated in a suitable furnace and ambient to a temperature a little above the melting point of the soft metallic surface layer. The soft metal, which may be lead, tin, lead-tin alloys, and the like, melts and flows around the electrical lead wires during this heating step. On cooling the assemblage, all the electrical lead wires are bonded to their respective metallic contacts. This embodiment thus enables a large number of electrical lead wires to be attached to a large number of semiconductor devices in a single operation, thus reducing the handling time and the unit cost of the devices.

*Example IV*

In the embodiment described next, the metallic contacts are provided with a surface layer of soft solderable metal by electroplating.

Figures 12, 13, 14, 15:
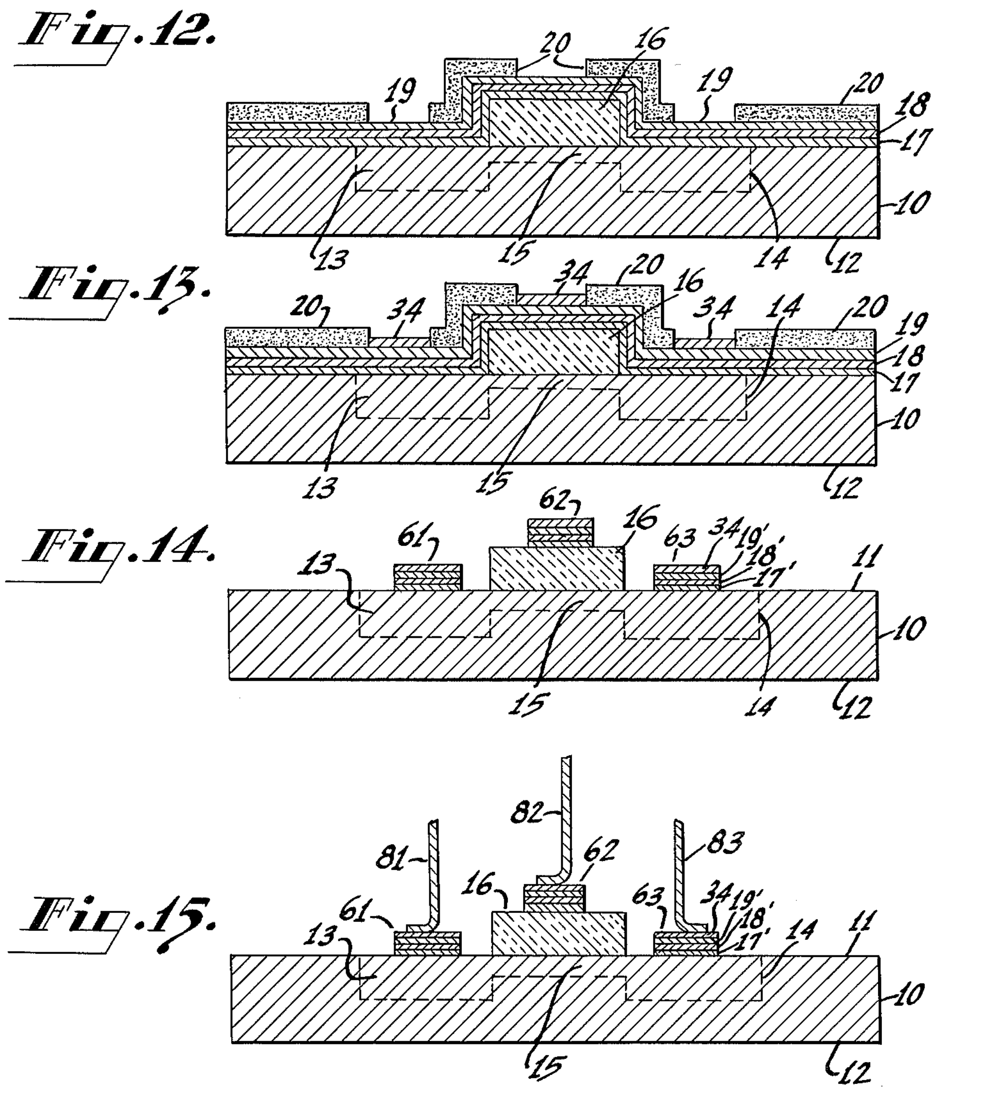

Referring now to FIGURE 12, semiconductor wafer 10 is first prepared as described in Example II above, and illustrated in FIGURE 7, with a chromium film 17 deposited on one major wafer face 11, a mixed silver-chromium layer 18 over film 17, and a silver layer 19 over layer 18. The silver layer 19 is then coated with a photoresist layer 20, which is exposed to a suitable light pattern and developed. The portions of silver layer 19 thus left exposed are those on which it is desired to form the metallic contacts to the device.

A thin layer 34 (FIGURE 13) of soft solderable metal is now deposited on the exposed portions of silver layer 19 by treating wafer 10 in a suitable plating bath. Tweezer electrodes may be utilized to make the necessary connections to the plating bath electrodes. The electroplated layer 34 may consist of lead, tin, lead-tin alloys, or the like. In this example, layer 34 consists of a 40 lead-60 tin alloy similar to lead-tin solder, and is suitably about 0.1 to 0.5 mil thick.

The remaining portions of photoresist layer 20 are removed by means of a suitable stripper, thus exposing that portion of silver layer 20 which is not covered by the plated metal 34. Wafer 10 is then treated in etchants to remove all of layers 17, 18 and 19, except for those portions of these layers covered by the plated metal 34. In this example, wafer 10 is treated first in an ammonium persulfate bath as described above in Example I to remove the exposed silver, and then in an alkaline ferricyanide bath to remove the exposed chromium. Since the lead-tin layer 34 is not dissolved by these etchants, metallic contacts 61, 62 and 63 (FIGURE 14) are thus left on the wafer. In this embodiment, each metallic contact consists of four layers: a chromium layer 17′ deposited directly on the semiconductor or on an insulator; a mixed silver-chromium layer 18′ on chromium layer 17′; a pure silver layer 19′ on layer 18′; and a lead-tin solder layer 34 on silver layer 19′. If desired, the metallic contacts 61, 62 and 63 may be stabilized by heating the wafer in air for about 5 to 20 minutes at about 100° C. to 300° C.

Referring now to FIGURE 15, the electrical lead wires 81, 82 and 83 are attached to the metallic contacts 61, 62 and 63 as described in Example III above.

It will be understood that the above examples are by way of explanation only, and not limitation, since various modifications may be made without departing from the spirit and scope of the invention. The fabrication of only one type of semiconductor device has been described for greater clarity, but it will be understood that metallic contacts may also be fabricated on other types such as triodes, and on diodes and tetrodes, in the same manner. If desired, the metallic contacts may be covered with a flash of gold or other noble metal. Other etchants may be utilized, such as a mixture of 19 volumes concentrated sulfuric acid and one volume concentrated nitric acid instead of the ammonium persulfate solution.

What is claimed is:

1. A semiconductor device comprising a crystalline silicon wafer, a chromium film on a portion of a major face of said wafer, a thin silver-chromium layer on said chromium film, a thin silver layer on said silver-chromium layer, and an electrical lead wire attached to said silver layer.

2. A semiconductor device comprising a crystalline silicon wafer, a chromium film on a portion of a major face of said wafer, a thin silver-chromium layer on said chromium film, a thin silver layer on said silver-chromium layer, a soft solderable metallic layer on said silver layer, and an electrical lead wire attached to said solderable layer.

3. A semiconductor device comprising a monocrystalline silicon wafer having an insulating layer on a portion of one major wafer face, a chromium film on a portion of said insulating layer and on a portion of said wafer face adjacent said insulating layer, a thin silver-chromium layer on said chromium film, a thin silver layer on said silver-chromium layer, a soft solderable metallic layer on said silver layer, and electrical lead wires attached to said solderable layer on said insulating layer and on said wafer face adjacent said insulating layer.

4. A semiconductor device comprising a monocrystalline silicon wafer having a silicon oxide layer on a portion of one major face, a chromium film on a portion of said silicon oxide layer and on a portion of said wafer face adjacent said silicon oxide layer, a thin silver-chromium layer on said chromium film, a thin silver layer on said silver-chromium layer, a layer of lead-tin alloy on said silver layer, and electrical lead wires attached to said lead-tin layer on said silicon oxide layer and on said wafer face adjacent said silicon oxide layer.

References Cited by the Examiner

UNITED STATES PATENTS

| | | | |
|---|---|---|---|
| 2,820,932 | 1/1958 | Looney | 317—240 |
| 2,910,394 | 10/1959 | Scott | 148—1.5 |
| 2,913,357 | 11/1959 | Ostrofsky | 117—107.2 |
| 2,922,092 | 1/1960 | Gazzara | 317—240 |
| 2,950,219 | 8/1960 | Pohl | 148—1.5 |
| 2,962,806 | 12/1960 | Stumbock | 29—195 |
| 2,971,251 | 2/1961 | Willhelmse | 29—195 |

HYLAND BIZOT, *Primary Examiner.*